(12) United States Patent
Dogiamis et al.

(10) Patent No.: US 11,694,962 B2
(45) Date of Patent: Jul. 4, 2023

(54) MICROELECTRONIC PACKAGE WITH MOLD-INTEGRATED COMPONENTS

(71) Applicant: Intel Corporation, Santa Clara, CA (US)

(72) Inventors: Georgios Dogiamis, Chandler, AZ (US); Aleksandar Aleksov, Chandler, AZ (US); Feras Eid, Chandler, AZ (US); Telesphor Kamgaing, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 99 days.

(21) Appl. No.: 17/229,991

(22) Filed: Apr. 14, 2021

(65) Prior Publication Data

US 2021/0233856 A1     Jul. 29, 2021

Related U.S. Application Data

(63) Continuation of application No. 16/667,698, filed on Oct. 29, 2019, now Pat. No. 11,011,470.

(51) Int. Cl.

| H01L 23/538 | (2006.01) |
| B81B 7/00 | (2006.01) |
| H01L 23/28 | (2006.01) |
| H01L 23/552 | (2006.01) |
| H01L 21/56 | (2006.01) |

(52) U.S. Cl.
CPC ........ *H01L 23/5385* (2013.01); *B81B 7/0006* (2013.01); *B81B 7/007* (2013.01); *H01L 21/565* (2013.01); *H01L 23/28* (2013.01); *H01L 23/5384* (2013.01); *H01L 23/552* (2013.01)

(58) Field of Classification Search
CPC . H01L 23/5385; H01L 23/28; H01L 23/5384; H01L 23/552; H01L 21/565; B81B 7/0006; B81B 7/007
USPC ......................................................... 257/774
See application file for complete search history.

(56) References Cited

U.S. PATENT DOCUMENTS

| 9,941,257 | B2 * | 4/2018 | Lin | ................... H01L 21/76802 |
| 2015/0282367 | A1 * | 10/2015 | Barth | ..................... H05K 7/023 361/728 |
| 2018/0033777 | A1 * | 2/2018 | Lin | ........................ H01L 21/565 |
| 2019/0006339 | A1 * | 1/2019 | Lau | .......................... H01L 24/05 |
| 2019/0355680 | A1 * | 11/2019 | Chuang | ............... H01L 23/5389 |

\* cited by examiner

*Primary Examiner* — Tu-Tu V Ho
(74) *Attorney, Agent, or Firm* — Akona IP (57) ABSTRACT

Embodiments may relate to a microelectronic package that includes an overmold material, a redistribution layer (RDL) in the overmold material, and a die in the overmold material electrically coupled with the RDL on an active side of the die. The RDL is configured to provide electrical interconnection within the overmold material and includes at least one mold interconnect. The microelectronic package may also include a through-mold via (TMV) disposed in the overmold material and electrically coupled to the RDL by the mold interconnect. In some embodiments, the microelectronics package further includes a surface mount device (SMD) in the overmold material. The microelectronics package may also include a substrate having a face on which the overmold is disposed.

19 Claims, 7 Drawing Sheets

MICROELECTRONIC PACKAGE WITH MOLD-INTEGRATED COMPONENTS

CROSS REFERENCE TO RELATED APPLICATION

This Application is a continuation (and claims benefit of priority under 35 U.S.C. § 120) of U.S. application Ser. No. 16/667,698, filed Oct. 29, 2019, entitled "MICROELECTRONIC PACKAGE WITH MOLD-INTEGRATED COMPONENTS." The disclosure of this prior application is considered part of (and is incorporated by reference in) the disclosure of this application.

BACKGROUND

It may be desirable for discrete dies, and particularly radio frequency (RF) related dies such as power amplifiers (PAs) to be communicatively coupled to one another or to other dies on a RF system in package (SiP). Often, such SiPs use wirebonds and two-dimensional integration schemes to couple various of the dies to one another.

DETAILED DESCRIPTION

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As previously noted, it may be desirable for dies such as PAs to be connected to one another or to other dies in or on a microelectronic package such as a RF SiP. In legacy microelectronic packages, wirebonds may have been used to connect the dies first to the package substrate, and then through the package substrate (and particularly interconnects in the package substrate) to other passive or active components or dies of the microelectronic package.

Additionally, legacy microelectronic packages may have commonly used planar 2D integration schemes where all the components of the microelectronic package were in a single layer and adjacent to one another. These schemes may have relied on the use of semiconductor packaging materials (e.g., low-temperature co-fired ceramic (i), organic, or some other type of semiconductor package material) to interconnect between the different components in the SiP. In these legacy microelectronic packages, architectures with up to 10 metal layers may have been used in conjunction with a second level interconnect (SLI) of a ball grid array (BGA) or land grid array (LGA) type. Several (e.g., greater than 40) passive devices such as resistors, inductors, or capacitors may be mounted as surface mount devices (SMDs) on the package, or may be implemented as integral elements of the package substrate utilizing the metal layers of the package substrate. Additionally, if high-Q inductors are desired, those may be placed in or on the outermost metal layers of the package substrate, while lower-Q inductors may use up to 4 metal layers of the package substrate. The microelectronic package may then be overmolded to protect the devices from the environment.

In addition, an electromagnetic interference (EMI) solution may be implemented in legacy packages as a conductive thin layer of copper (Cu) that covers the outer surface of the microelectronic package and is connected to ground layers of the microelectronic package, resulting in a structure akin to that of a "Faraday cage."

Further, wirebonds may be used in legacy packages to shield specific devices from interference while via walls inside the package may further help for cross-talk reduction. The thermal solution (for the dies or other components of the microelectronic package) may be implemented using an array of thermal vias inside of the packaging substrate, since the current solution may use a face-up approach (i.e., with the active side of the die or SMD facing away from the package substrate) for assembling the dies in the system. The wirebonds may be used to interconnect the dies or SMDs to the package substrate.

Generally, filters in legacy packages may include the interconnection of several (e.g., 10-20) acoustic resonator dies such as surface acoustic wave (SAW) resonators, bulk acoustic wave (BAW) resonators, thin-film bulk acoustic resonators (FBARs), or some other type of resonator may be included along with appropriate matching circuits such as inductors, Typically, 3 or 4 layers of the package substrate may have been occupied by the matching inductors underneath the die shadow. Other dies such as integrated passive devices (IPDs), switches, digital logic dies, etc. may also be placed on the package and may likewise need to be interconnected using wirebonds.

However, the thermal solution of legacy packages, especially for face-up mounted dies, heat may only be extracted through the die into the substrate on which the die is mounted, for example through via arrays. This solution may render layers below the die shadow to be undesirable for signal routing. However, as die performance, and particularly PA performance, requirements become more stringent, this heat extraction path may be insufficient to meet design criteria. However, since face-up die interconnects to the package substrate are wirebonds in legacy packages, there may be no practical solution to extract heat from the top of the die (e.g., the portion of the die that is facing away from the package substrate). Such heat extraction from the top of the die could be desirable, because any such mechanisms would necessarily be close to the active side of the die, and therefore the heat extraction could be more efficient than the legacy techniques.

Additionally, wirebonds in legacy microelectronic packages can lead to an increase in package area due to design rules on how the wire can be guided from the pad of the die to the pad of the substrate. Specifically, if wirebonds are used for RF shielding, then the wirebonds may noticeably increase z-height of the microelectronic package.

Finally, in 2D planar approaches, the trace lengths may be increased in order to interconnect the various dies and components of the microelectronic package, which may lead to reduced space available for additional components, increased insertion loss, increased layer count of the package substrate, or increased costs of the microelectronic package.

By contrast to the above-described legacy microelectronic packages, embodiments herein may relate to the integration of SMDs in the mold. Embodiments may also include an interconnect layer (which may also be referred to as a redistribution layer (RDL) or a "mold RDL") in the overmold compound. In some embodiments, the RDL may be used for one-turn in-mold inductors. Active devices such as the above-described dies may further be embedded in the mold compound.

Embodiments herein may provide several significant benefits over the above-described legacy microelectronic packages. For example, embodiments may result in a reduction of lateral (e.g., X-Y) area of the microelectronic package. Moreover, with the use of flip-chip type dies, the total z-height of the microelectronic package may be decreased, even with a second layer of in-mold SMDs. In some embodiments, the total z-height of the microelectronic package may be at or below approximately 1 millimeter (mm). Additionally, certain in-mold elements or components such as through-mold vias (TMVs) or mold interconnects may be used to create EMI shields for various of the elements such as the dies, which may further reduce z-height of the microelectronic package. Embodiments may also provide a higher interconnect density and/or decreased interconnect loss between RF dies/components than is possible with wirebond-based approaches. Finally, some embodiments may provide increased thermal efficiency with an added thermal path within the mold material. Other advantages may be present in other embodiments, as will be recognized by one of skill in the art.

Figure 1:
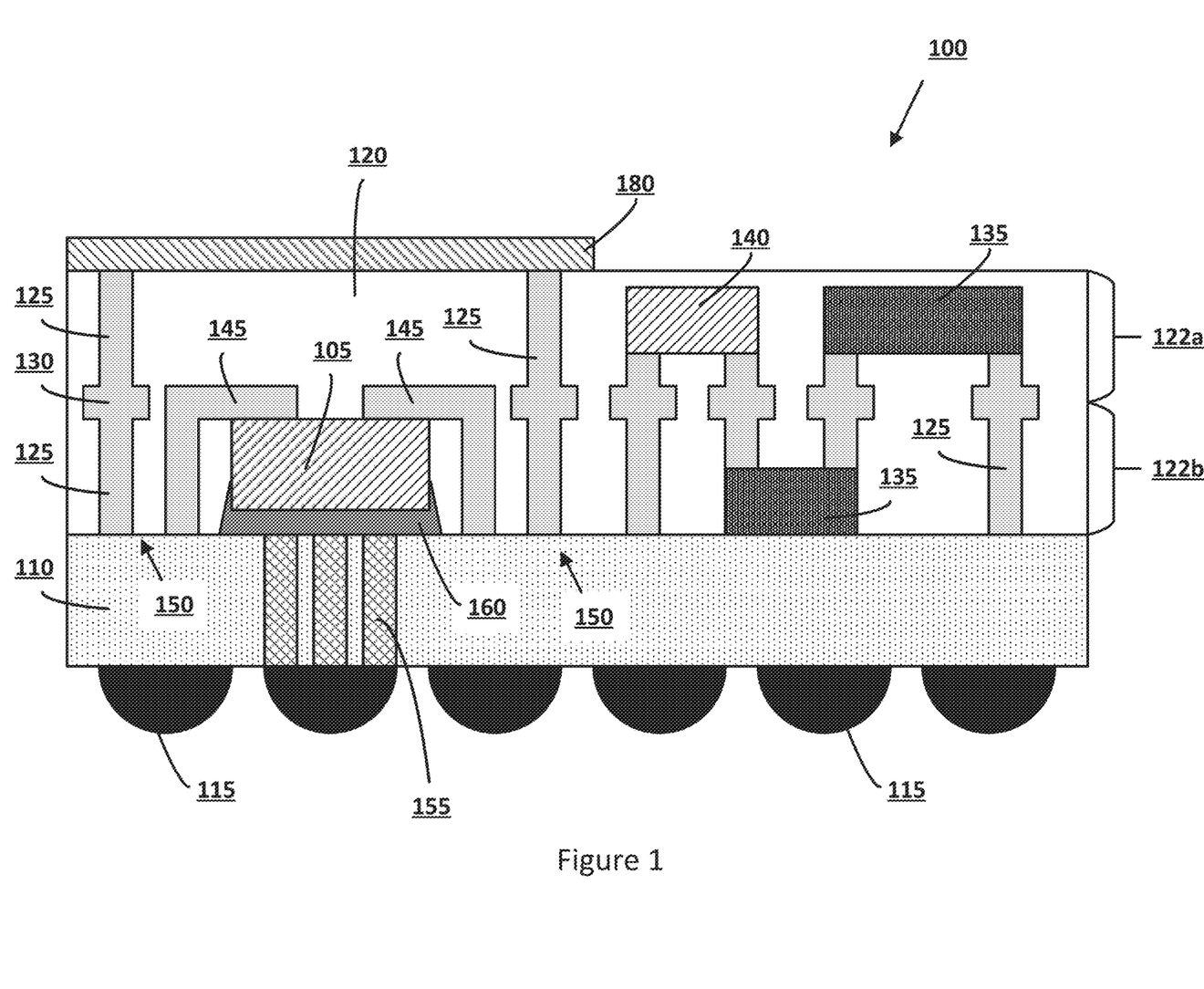
FIG. 1 depicts an example of a microelectronic package with mold-integrated components, in accordance with various embodiments herein.
Figure 2:
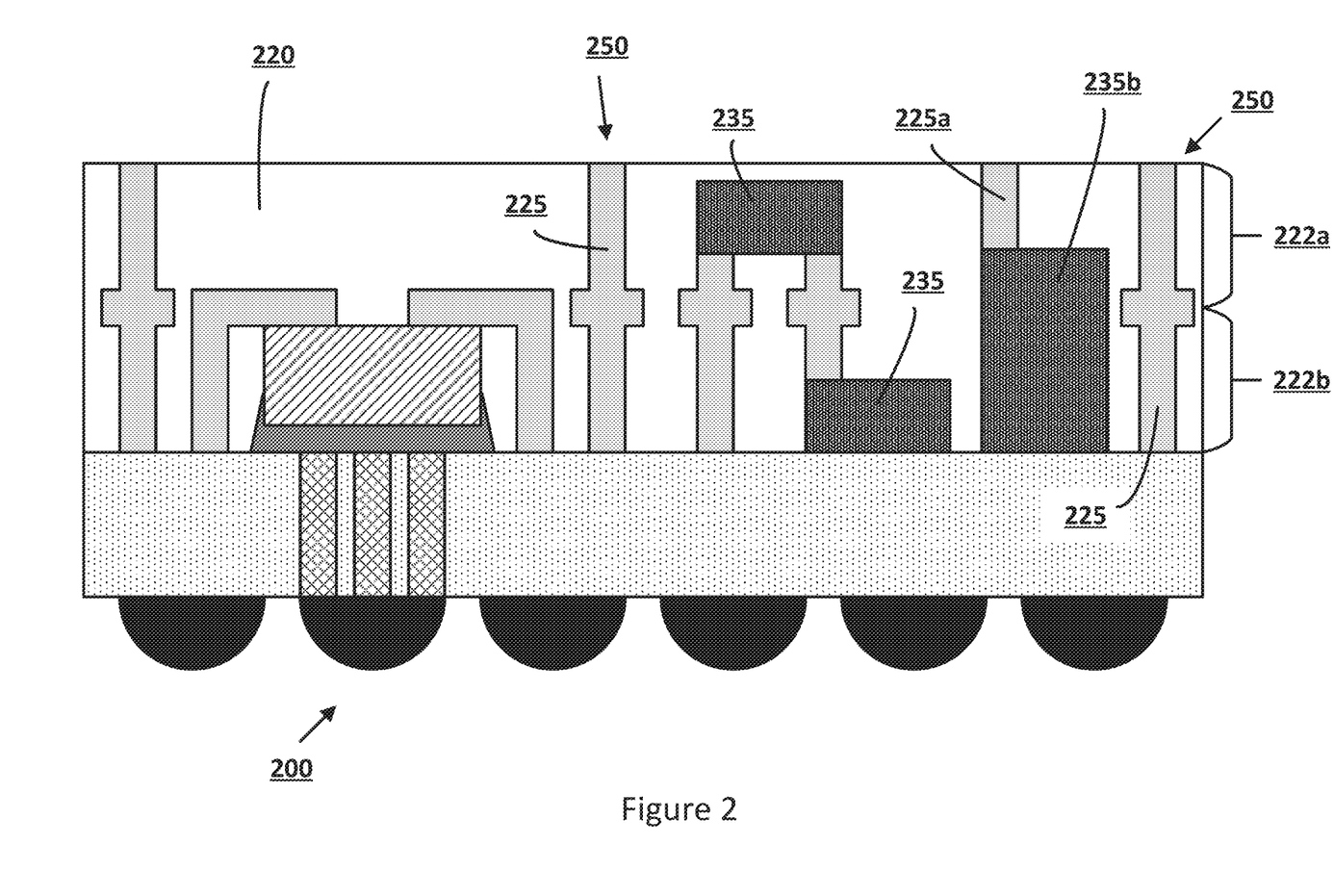
FIG. 2 depicts an alternative example of a microelectronic package with mold-integrated components, in accordance with various embodiments herein.
Figure 3:
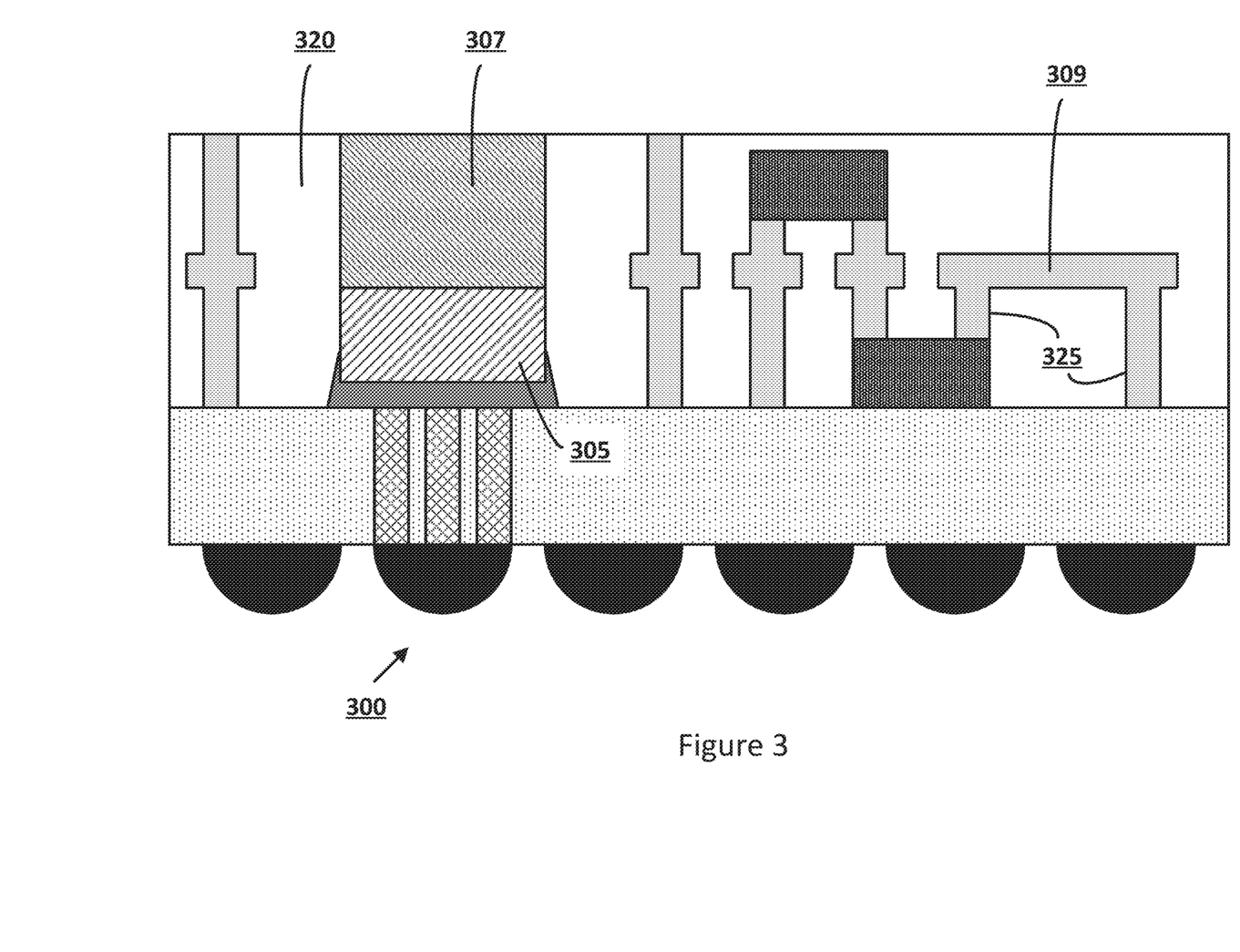
FIG. 3 depicts an alternative example of a microelectronic package with mold-integrated components, in accordance with various embodiments herein.

FIGS. 1-3 depict various example configurations of microelectronic packages with mold-integrated components. It will be understood that each element of the various Figures may not be explicitly numbered, however elements that are similar to other enumerated elements with respect to shape, position, or shading may be considered to have characteristics similar to those elements. For example, in FIG. 1, each and every TMV 125 may not be specifically enumerated. Similarly, certain elements of FIG. 1 such as the underfill material 160 may not be re-numbered in FIG. 2 or 3. However, those elements of FIG. 2 or 3 that share characteristics with those of FIG. 1, or those elements of FIG. 1 that share characteristics of other enumerated elements of FIG. 1, may be considered to share characteristics similar to those described herein.

Specifically, an in-mold second layer assembly approaches may be depicted in FIGS. 1-3. Dies such as a PA may be introduced as a face-up die. Instead of wirebonds as may be present in legacy microelectronic packages, planar in-mold interconnects may be introduced to further reduce z-height of the resultant microelectronic package.

Additionally, vertical TMVs may connect an outer EMI shield to the package substrate ground. These vertical TMVs may further enhance EMI protection and reduce electrical cross-talk of the components of the microelectronic packages. These vias may be lithographically defined and may be of various shapes, which may enable a continuous via wall around the microelectronic packages or one or more components thereof. A continuous via wall may provide lower EMI levels and/or reduced cross-talk between neighboring interconnects.

In some embodiments the overmold material may have a plurality of layers, and various of the layer may have a thickness (i.e., z-height) of between approximately 100 micrometers ("microns") and approximately 200 microns. In some embodiments, the TMVs may have a width or length (for example, as measured in a direction parallel to the face of the package substrate to which they are coupled) of between approximately 50 and approximately 100 microns. Additionally, passive devices or dies of the microelectronic package 100 may have a z-height of less than 200 microns in some embodiments.

In-mold metal layers may be used for high-Q inductors if the dielectric material of the overmold has a relatively low dielectric loss tangent such as on the order of less than approximately 0.01. In this embodiment it may be desirable for the metal layer to have a thickness or z-height of greater than approximately 5 microns. By combining such a dielectric material with the metal layer, an inductor with a Q-value of greater than approximately 50 may result.

Some embodiments such as FIG. 1 may additionally include a thermal path that includes an adhesive underfill material and an array of substrate vias. However, in other embodiments a thermal conductive material may also be placed inside of the overmold to provide an additional thermal path to the top of the microelectronic package. Such an embodiment may be depicted, and described in further detail, in FIG. 3, below.

However, it will be understood that these dimensions may vary in other embodiments. For example, the dimensions may be based on specific design characteristics of the microelectronic package, specific use cases, components or materials used, etc.

Specifically, FIG. 1 depicts a microelectronic package 100 a die 105 coupled with a package substrate 110. The die 105 may be or include, for example, a processor such as a central processing unit (CPU), general processing unit, a core of a distributed processor, or some other type of processor. Alternatively, the die 105 may be include a memory such as a double data rate (DDR) memory, a nonvolatile memory (NVM), a volatile memory, a read-only memory (ROM), or some other type of memory or die. In some embodiments the die 105 may be or include a RF chip or RF circuitry that is configured to generate, process, transmit, or receive a wireless signal such as a third generation (3G), a fourth generation (4G), a fifth generation (5G), a Wi-Fi, or some other type of wireless signal. As an example, the die 105 may be or include a digital logic, a PA, a switch, or some other type of die discussed herein.

The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, microstrips, striplines, etc. The conductive elements may be internal to, or on the surface of, the package substrate. Generally, the conductive elements may allow for the routing of signals through the package substrate 110, or between elements that are coupled to the package substrate 110. In some embodiments the package substrate 110 may be, for example, a printed circuit board (PCB), an interposer, a motherboard, or some other type of substrate.

Generally, the package substrate 110 may further include one or more interconnects 115. The interconnects 115 may be referred to in some embodiments as SLIs. The interconnects 115 may be, for example, solder bumps that are formed of a material such as tin, silver, copper, etc. If solder bumps are used for the interconnects 115, then the solder bumps may be elements of a BGA as shown in FIG. 1. In other embodiments, the interconnects 115 may be pins of a pin grid array (PGA), elements of an LGA, or some other type of interconnect. Generally, the interconnects 115 may physically or communicatively couple the package substrate 110 and, more generally, the microelectronic package 100, with another element of an electronic device such as a motherboard, a PCB, an interposer, etc. For example, one or more of the interconnects 115 may physically couple with, and allow electrical signals to pass between, pads of the package substrate 110 and another element of the electronic device of which the microelectronic package 100 is a part. In other embodiments, the interconnects 115 may physically couple the package substrate 110 with the other element of the electronic device, but may not communicatively couple the package substrate with the other element of the electronic device.

The die 105 may be communicatively and physically coupled with the package substrate 110 by one or more interconnects which may be similar to interconnects 115. The interconnects are not shown in FIG. 1 for the sake of clarity of the Figure. However, the interconnects that couple the die 105 to the package substrate 110 may offset the die 105 as shown in FIG. 1. The microelectronic package 100 may further include an underfill material 160 that at least partially surrounds the interconnects. The underfill material 160 may also at least partially surround the die 105, and may at least partially fill space between the die 105 and the package substrate 110. Generally, the underfill material 160 may lend further structural stability to the microelectronic package 100 and strengthen the connection between the die 105 and the package substrate 110. In some embodiments, the underfill material 160 may be formed of a polymer material such as epoxy or some other material.

In other embodiments, the underfill material 160 may be an adhesive capillary underfill (CUF) material or a die attach film (DAF) which may thermally couple the die 105 and the package substrate 110. In this embodiment, the package substrate 110 may include a number of substrate vias 155. The substrate vias 155 may be formed of a thermally conductive material such as copper, and may thermally couple the underfill material 160 with the interconnects 115 or some other element at the side of the package substrate 110 adjacent to the interconnects 115. In this manner, the underfill material 160 and the substrate vias 155 may together serve as a thermal solution for the die 105, i.e., allowing heat to flow away from the die 105.

The microelectronic package 100 may further include an overmold material 120. The overmold material 120 may be formed of a generally dielectric material such as epoxy, silica-filled epoxy, ceramic-filled epoxy, etc. Generally, the overmold material 120 may be electrically insulative, thermally insulative, or some combination thereof. In some embodiments, the overmold material 120 may be composed of two or more overmold layers 122a and 122b. The overmold layers 122a/122b may generally be layers of the overmold material 120 that are deposited at different times, as will be described in further detail with respect to FIGS. 4 and 5. In some embodiments, respective ones of the overmold layers 122a and 122b may be composed of the same material, while in other embodiments overmold layer 122a may be formed of a different overmold material than overmold layer 122b. It will be understood that two overmold layers 122a and 122b are depicted in FIG. 1 for the sake of discussion, and other embodiments may have more or fewer overmold layers than those depicted.

The overmold material 120 may have a number of elements positioned therein. For example, the overmold material 120 may have a number of TMVs 125 positioned therein. The TMVs 125 may be formed of, or include, an electrically-conductive material such as copper or some other material. In some embodiments, the TMVs 125 may be lithographically formed and therefore may have a variety of differently shaped cross-sections. In some embodiments, the TMVs 125 may be communicatively or physically coupled by one or more pads 130 which are formed at a junction of the two layers 122a and 122b of the overmold material 120. It will be understood, however, that in some embodiments the pads 130 may not be present and one or more of the TMVs 125 in the overmold material 120 may be a unitary element.

The overmold material 120 may further have a number of SMDs 135 positioned therein. As noted above, the SMDs may be a passive device such as an inductor, a resistor, a capacitor, etc. Additionally or alternatively, the overmold material 120 may have one or more dies 140 positioned therein. The die 140 may be similar to die 105 in that die 140 may be a digital logic, a PA, a switch, a CPU, a general processing unit (GPU), a memory, or some other type of die.

The overmold material 120 may further include a number of mold interconnects 145. The mold interconnects 145 may also be referred to as "traces." Generally, the mold interconnects 145 may be formed of a conductive material such as copper or some other electrically-conductive material. As can be seen in FIG. 1, for example, the mold interconnects 145 may couple with an active side of the die 105. As used herein, the "active side" of the die 105 may refer to a side of the die 105 with one or more active transistors. As may be seen in FIG. 1, the mold interconnects 145 and one or more TMVs 125 may communicatively couple the active side of the die 105 with the package substrate 110, as described above. It will be noted that the mold interconnects 145 are generally at a junction of the two layers 122a and 122b of the overmold material 120, however in other embodiments the die 105 may be larger or smaller than depicted, so the mold interconnects 145 may not be at the junction of the two layers 122a and 122b. Additionally, although FIG. 1 only shows the die 105 being coupled to a TMV 125 by a mold interconnect 145, in other embodiments one or more of the SMDs 135 or the die 140 may be coupled with a TMV 125 by a mold interconnect 145.

As previously noted, in some embodiments it may be desirable to electromagnetically shield the die 105 or some other component of the microelectronic package 100. Therefore, in some embodiments one or more of the TMVs 125 and the pads 130 may form a shield TMV 150 as depicted in FIG. 1. As can be seen in FIG. 1, the shield TMVs 150 may extend through the entirety of the overmold material 120, and be coupled with the package substrate 110. More specifically, the shield TMVs 150 may be coupled with a ground connection or a ground plane of the package substrate 110.

In some embodiments, the shield TMVs 150 may be a unitary element, i.e., a single piece of material that fully surrounds the die 105. In another embodiment, the shield TMVs 150 may be a plurality of TMVs that generally surround the die 105 and are spaced closely enough together to provide EMI shielding to the die. In some embodiments, the microelectronic package 100 may include a thin EMI shield element 180 positioned on top of the overmold material 120 (i.e., on a face of the overmold material 120 that is opposite the face that is coupled with the package substrate 110) as depicted in FIG. 1. In these embodiments, the shield TMVs 150 may be coupled with both the package substrate 110 and the EMI shield 180. It will be understood that although the EMI shield 180 is shown as only being placed along a portion of the overmold material 120, in other embodiments the EMI shield 180 may extend along a greater or lesser portion of the overmold material and may in, some embodiments, extend along the entirety of the overmold material 120.

FIG. 2 depicts an alternative example of a microelectronic package with mold-integrated components, in accordance with various embodiments herein. Specifically, some embodiments may include components with the z-height greater than the height of a layer 122a or 122b of the overmold material 120. These components may be introduced to the package substrate through the use of a sacrificial material that is introduced during the first overmold process. The sacrificial material may then be removed, solder may be applied, and the taller component may be placed in the mold "cavity."

Specifically, FIG. 2 depicts the microelectronic package 200, which may include elements that are similar to, and share one or more characteristics of, the overmold package 100 of FIG. 1. As previously noted, each and every element of FIG. 2 may not be specifically enumerated or are discussed herein.

The microelectronic package 200 may include various TMVs 225, shield TMVs 250, and an SMD 235, which may be respectively similar to, and share one or more characteristics of, TMVs 125, shield TMVs 150, and SMD 135. Various of the elements of FIG. 2 may be in an overmold material 220 with layers 222a and 222b, which may be respectively similar to overmold material 120, layer 122a, and layer 122b.

The microelectronic package 200 may further include an SMD 235b, which may be similar to, and share one or more characteristics with, SMD 235. However, as can be seen in FIG. 2, SMD 235b may be taller than layer 222b of the overmold material 220. More specifically, SMD 235b may extend through layer 222b and layer 222a. As noted, SMD 235b may be placed into the overmold material 2203 use of a sacrificial material that is present during deposition of the layer 222b. The sacrificial material may then be removed, SMD 235b may be placed into the resultant cavity, and then layer 222a may be deposited. In some embodiments, an additional TMV 225a may be present in layer 222a. Specifically, as can be seen, TMV 225a may be shorter than another of the TMVs 225. The shorter TMV 225a may be desirable based on the increased z-height of SMD 235b.

Additionally, as can be seen in FIG. 2, additional shield TMVs 250 may be present in the overmold material 220. Specifically, shield TMVs 250 may be present on either side of the various SMDs 235 and 235b. In some embodiments, the microelectronic package 200 may further include an EMI shield element similar to EMI shield element 180. The shield TMVs 250 may connect to the EMI shield element, to electromagnetically shield the SMDs 235 and 235b. This additional EMI shield element is not depicted in FIG. 2 for the sake of clarity of the Figure, and elimination of redundancy.

FIG. 3 depicts an alternative example of a microelectronic package 300 with mold-integrated components, in accordance with various embodiments herein. Specifically, as previously noted in some embodiments may be desirable for a thermal path to be introduced into the overmold material. FIG. 3 depicts a microelectronic package 300 with a thermal conductive material introduced in a mold cavity and coupled to the die 305. This thermal conductive material may enable a thermal path to the top side of the microelectronic package 300.

Specifically, the microelectronic package 300 may include a die 305, an overmold material 320, and TMVs 325, which may be respectively similar to die 105, overmold material 120, and TMVs 125. As can be seen, the microelectronic package 300 may further include a thermal conductive material 307 that is coupled with the die 305. The thermal conductive material 307 may be, for example, copper or some other type of thermal conductive material. In some embodiments, the microelectronic package 300 may include a thermal interface material, an integrated heat spreader, or some other additional thermal solutions that is thermally coupled to the top side of the microelectronic package 300, and more specifically, to the thermal conductive material 307. It will be noted that traces or mold interconnects such as mold interconnects 145 are not depicted in FIG. 3 for the sake of clarity of the Figure. However, in some embodiments, traces or mold interconnects such as mold interconnects 145 may be present and coupled with the die 305 in conjunction with the thermal conductive material 307.

Additionally, the microelectronic package 300 may include a high-Q inductor 309. The high-Q inductor 309 may be, for example, a trace of an electrically-conductive material that is similar to the electrically-conductive material used for TMVs 325, mold interconnects 145, or some other type of electrically-conductive material. As noted above, the high-Q inductor 309 may have a z-height of approximately 5 microns, however in other embodiments the high-Q inductor 309 may be taller or shorter depending on factors such as use cases, design considerations, materials used, etc.

It will be understood that the embodiments depicted in FIGS. 1-3 are intended as example embodiments to show various characteristics or features of the present disclosure. Additionally, FIGS. 1-3 are intended as highly simplified Figures and may not show each and every element which may be present in the microelectronic packages. For example, various of the FIGS. 1-3 may not show various pillars or other interconnect structures which may be used to physically are communicatively couple elements such as the dies, the SMDs, etc. The specific number, configuration, shape, or size of the various depicted components is not intended to be determinative unless otherwise specifically noted. For example, a microelectronic package may have more or fewer dies, SMDs, vias, interconnects, etc. than are depicted in the Figures. Additionally, aspects of various of the Figures may be combined. For example, the high-Q inductor 309 may be present in microelectronic packages 100 or 200. Other features may be similarly combined.

Figure 4:
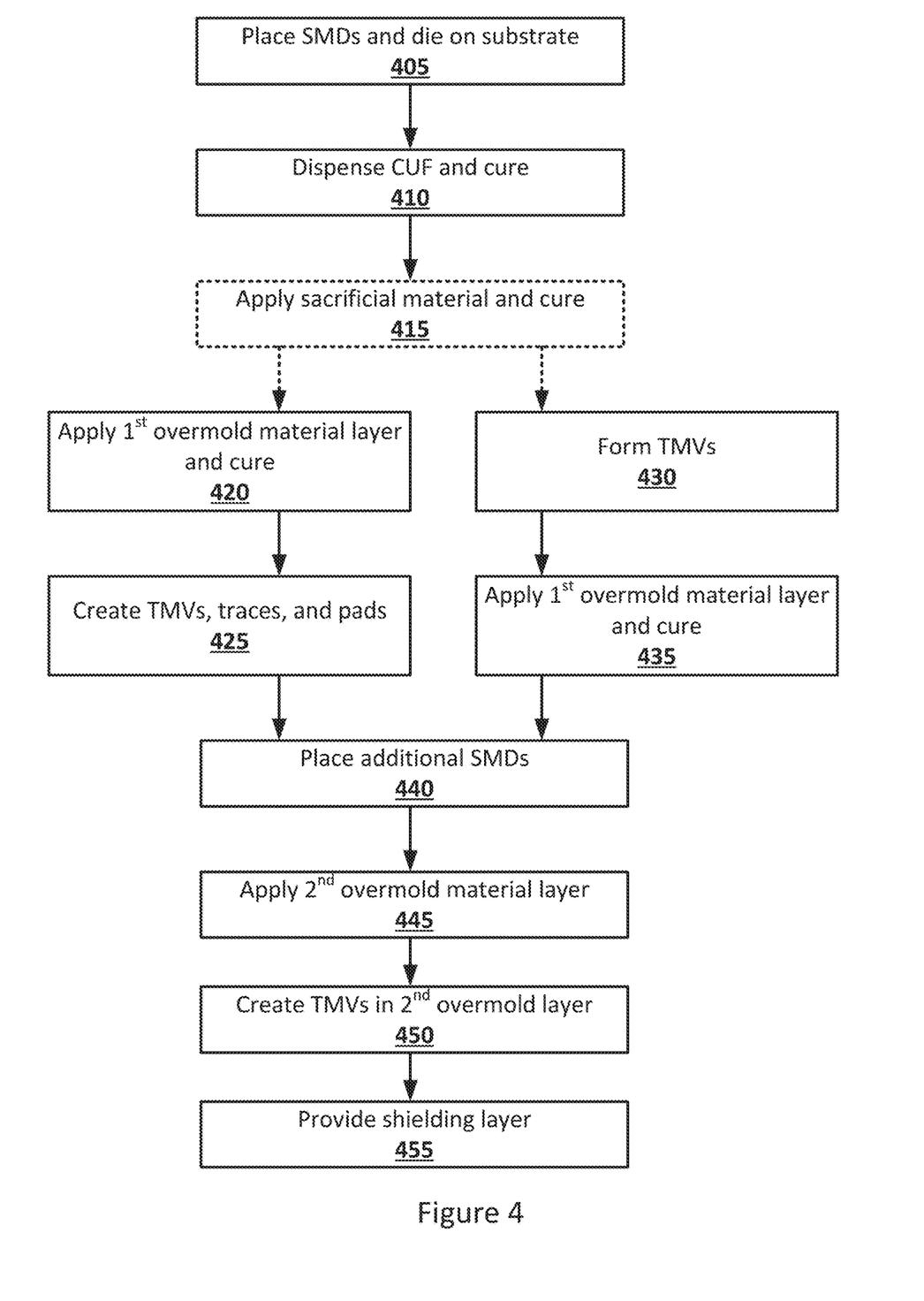
FIG. 4 depicts an example technique for the manufacture of a microelectronic package with mold-integrated components, in accordance with various embodiments herein.

FIG. 4 depicts an example technique for the manufacture of a microelectronic package with mold-integrated components, in accordance with various embodiments herein. Generally, the technique will be described with reference to elements of FIG. 1. However, it will be understood that the technique may be applicable, in whole or in part, with or without modification, to other embodiments of the present disclosure.

The technique may include placing, at 405, SMDs and die on a substrate. The SMDs may be similar to, for example, SMDs 135. The die may be similar to, for example, die 105. Placing the die or the SMDs on the substrate may include the introduction of interconnects such as those described above with respect to die 105. Placement of the SMDs or the die may be performed through techniques such as pick-and-place, or some other technique.

The technique may further include dispensing a CUF (or some other underfill material) and then performing a cure at 410. The underfill material may be similar to, for example, underfill material 160. The cure process may cure the underfill material, the interconnects that couple the die to the substrate, or both. The cure process may be based on a chemical reaction, a thermal reaction, or some other type of care process. It will be noted that in other embodiments where the DAF is used, the DAF may be dispensed or otherwise applied first, and then the die, SMDs, etc. may be positioned on the substrate.

The technique may optionally further include applying, at 415, a sacrificial material and performing an additional cure process. The sacrificial material may be the sacrificial material described above with respect to FIG. 2, and the SMD 235b. Specifically, the sacrificial material may be a material such as an epoxy or some other material which is positioned on the substrate prior to the deposition of an overmold layer so that a components such as an SMD that is taller than a single layer of the overmold material may be placed in the cavity that may result when the sacrificial material is removed.

The technique may then include applying, a 420, a first overmold material layer and performing a cure process. The first overmold material layer may be similar to, for example, layer 122b. Specifically, the overmold material layer may be placed on the substrate through deposition, lamination, or some other type of application technique. Similarly to the cure process described above with respect element 410, the cure process of element 420 may be a chemical cure, thermal cure, or some other type of cure process. Subsequent to element 420, the technique may include the creation, at 425, of one or more TMVs, traces or mold interconnects, and pads. The TMVs may be similar to, for example, TMVs 125. The pads may be similar to, for example, pads 130. The traces or mold interconnects may be similar to, for example, mold interconnects 145. In some embodiments, element 425 may further include the creation of a high-Q inductor such as inductor 309. The various components may be created through optical, chemical, or mechanical etching and then plating, or some other type of technique.

As an alternative to elements 420 and 425, subsequent to element 415, the technique may include forming, at 430, various of the TMVs such as TMVs 125. The TMVs may be formed through, for example, an etching and plating operation, or some other technique for TMV formation. Subsequent formation of the TMVs, the technique may include applying, at 435, a first overmold material layer and performing a cure process. The first overmold material layer may be similar to, for example, layer 122b. Specifically, the overmold material layer may be placed on the substrate through deposition, lamination, or some other type of application technique. Similarly to the cure process described above with respect element 410, the cure process of element 420 may be a chemical cure, thermal cure, or some other type of cure process.

Subsequent to element 425 or element 435, the technique may include placing, at 440, additional SMDs such as SMD 235b, or the SMDs depicted in overmold layer 122a of FIG. 1. Placement of the SMDs may be through a technique such as pick-and-place or some other technique as described above with respect to element 405. In some embodiments, if a sacrificial material is present from element 415, placement of the SMDs may include removal of the sacrificial element and placement of an SMD such a SMD 235b in the resultant cavity.

Subsequent to placement of the additional SMDs, the technique may include application, at 445, of a second overmold layer such as layer 122a of FIG. 1. Similarly to elements 420 or 435, application of the second overmold layer may be performed through deposition, lamination, or some other type of application technique. TMVs may then be created in the second overmold layer at 450. Additional elements such as additional traces, pads, etc. may likewise be created at 450. Similarly to element 425, the TMVs may be created through an etching and plating process, or some other type of process. It will be understood, however, that in other embodiments elements 445 and 450 may be replaced by an alternative such as formation of the TMVs prior to application of the second overmold layer in a manner similar to that described above with respect to elements 430 and 435.

Finally, a shielding layer such as EMI shield element 180 may be placed on the overmold material at 455. The shielding layer may be placed on the overmold material through lamination, deposition, pick-and-place, or some other technique.

Figure 5:
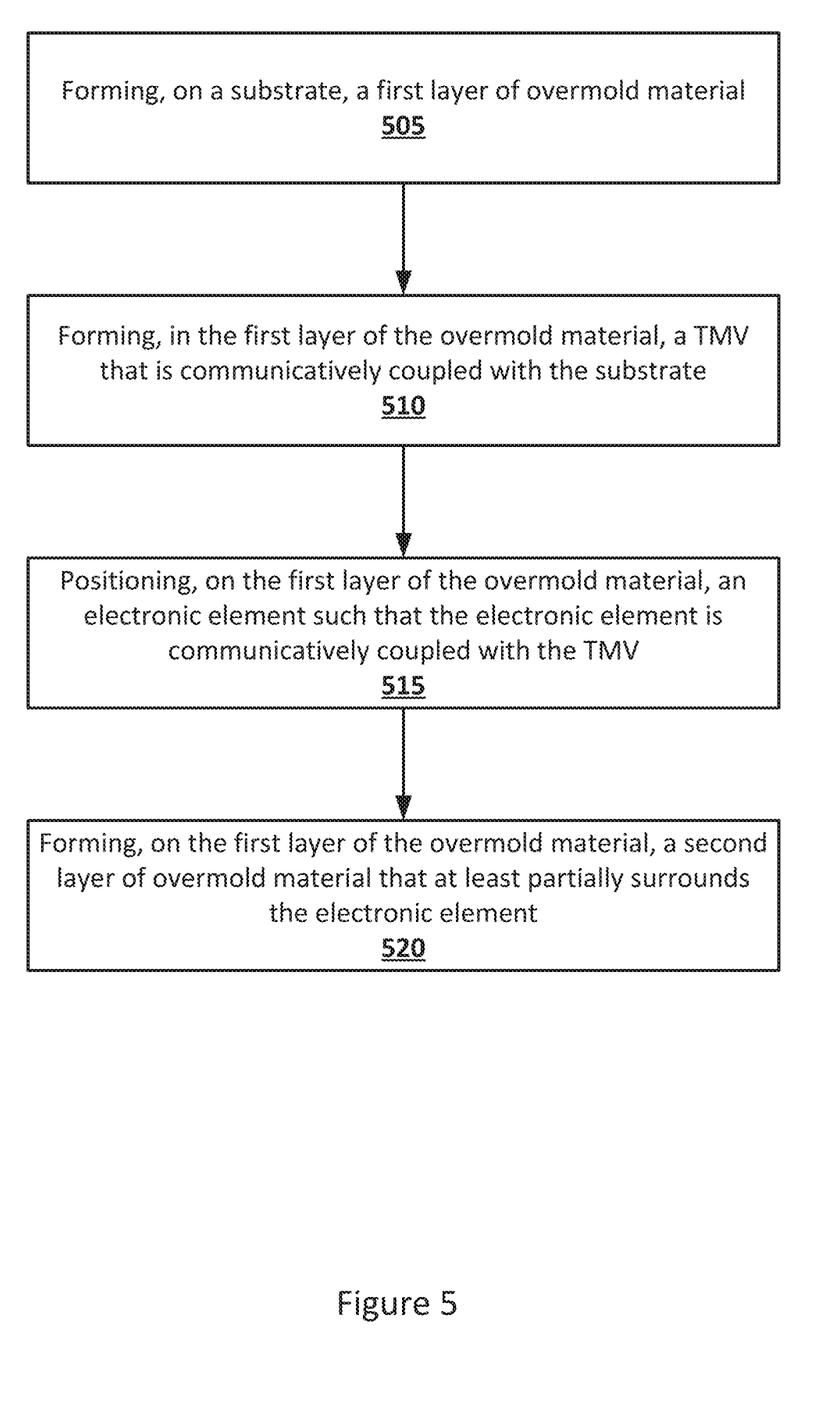
FIG. 5 depicts an alternative example technique for the manufacture of a microelectronic package with mold-integrated components, in accordance with various embodiments herein.

FIG. 5 depicts an alternative simplified technique whereby a microelectronic package such as those of FIGS. 1-3 may be manufactured. Similarly to FIG. 4, FIG. 5 may be discussed with reference to elements of FIG. 1, however it will be understood that the technique may be applicable, in whole or in part, with or without modification, to other embodiments.

The technique of FIG. 5 may include forming, on a substrate, a first layer of overmold material at 505. The substrate may be similar to package substrate 110. The first layer of the overmold material may be similar to, for example, layer 122b of overmold material 120. As noted above, the overmold material may be placed on the substrate through deposition, lamination, etc.

The technique may further include forming, in the first layer of the overmold material at 510, a TMV that is communicatively coupled with the substrate. The TMV may be similar to, for example, one of TMVs 125 or shield TMV 150. Formation of the TMV may be performed through, for example, etching followed by plating as described above, or some other technique.

The technique may further include positioning, at 515, on the first layer of the overmold material, an electronic element such that the electronic element is communicatively coupled with the TMV. The electronic element may be, for example, die 140, SMD 135, an inductor such as inductor 309, or some other electronic element. Positioning of the electronic element may be performed through pick-and-place, or, in the case of the inductor 309, through etching and plating of an electrically-conductive material. In other embodiments, positioning of the electronic element may be performed through some other technique.

The technique may further include forming, at 520, on the first layer of the overmold material, a second layer of overmold material that at least partially surrounds the electronic element. The second layer of overmold material may be, for example, layer 122a. As noted above, the overmold material may be placed on the substrate through deposition, lamination, etc.

It will be understood that the above techniques of FIGS. 4 and 5 are intended as simplified examples of techniques which may be used in accordance with various embodiments. However, other embodiments may have more or fewer elements, different elements, elements performed in a different order, etc. For example, in some embodiments element 510 may be performed prior to element 505 in a manner similar to that described with respect to elements 430 and 435 of FIG. 4. Other variations may be present in other embodiments.

Figure 6:
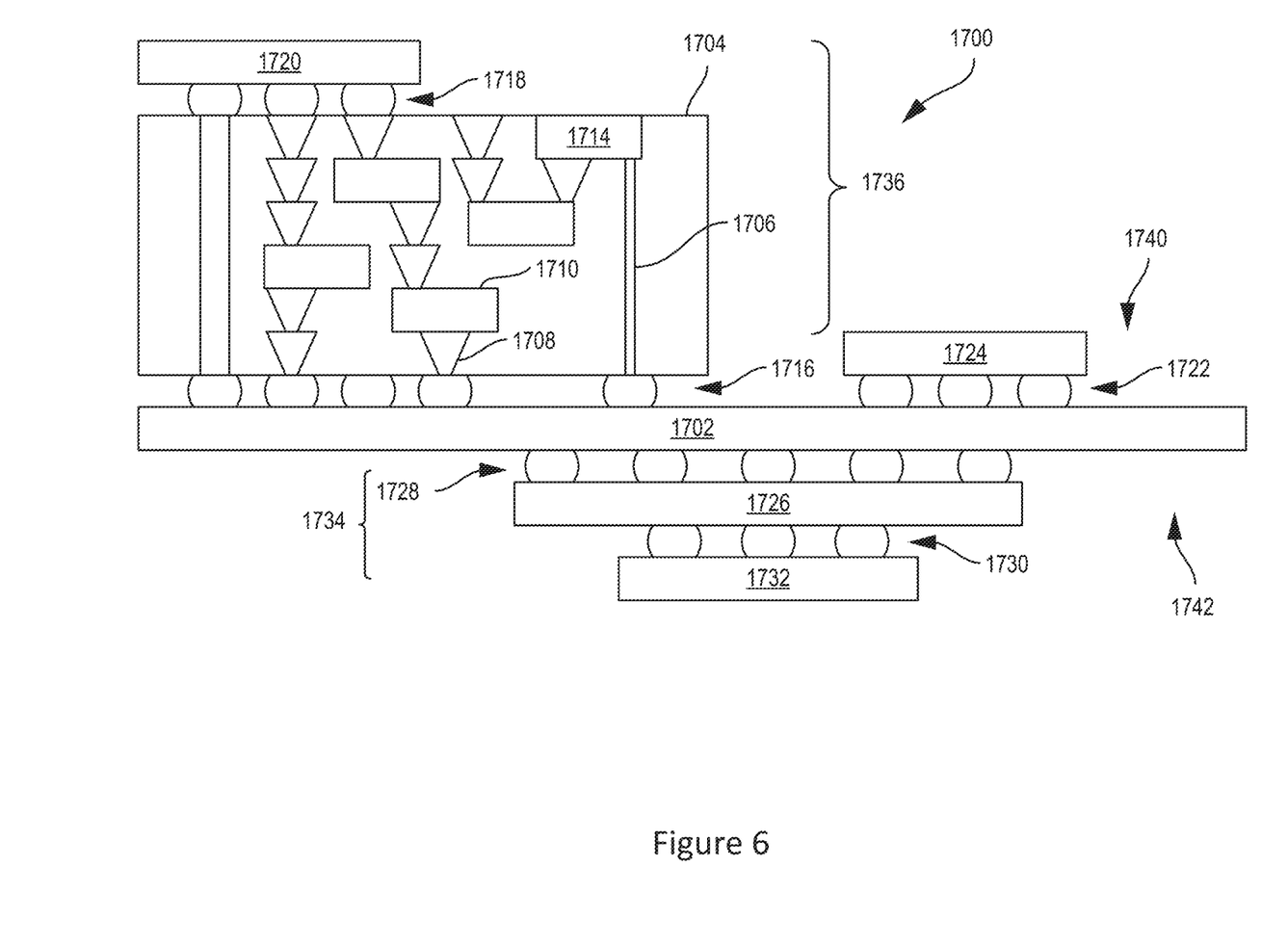
FIG. 6 is a side, cross-sectional view of an integrated circuit (IC) device assembly that may include a microelectronic package with mold-integrated components, in accordance with various embodiments.

FIG. 6 is a side, cross-sectional view of an IC device assembly 1700 that may include one or more microelectronic packages with mold-integrated components, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically-conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 6 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 6), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 6, multiple IC packages may be coupled to the package interposer 1704; indeed, additional interposers may be coupled to the package interposer 1704. The package interposer 1704 may provide an intervening substrate used to bridge the circuit board 1702 and the IC package 1720. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 6, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically-conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, PAs, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more microelectronic packages with mold-integrated components.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 6 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 7:
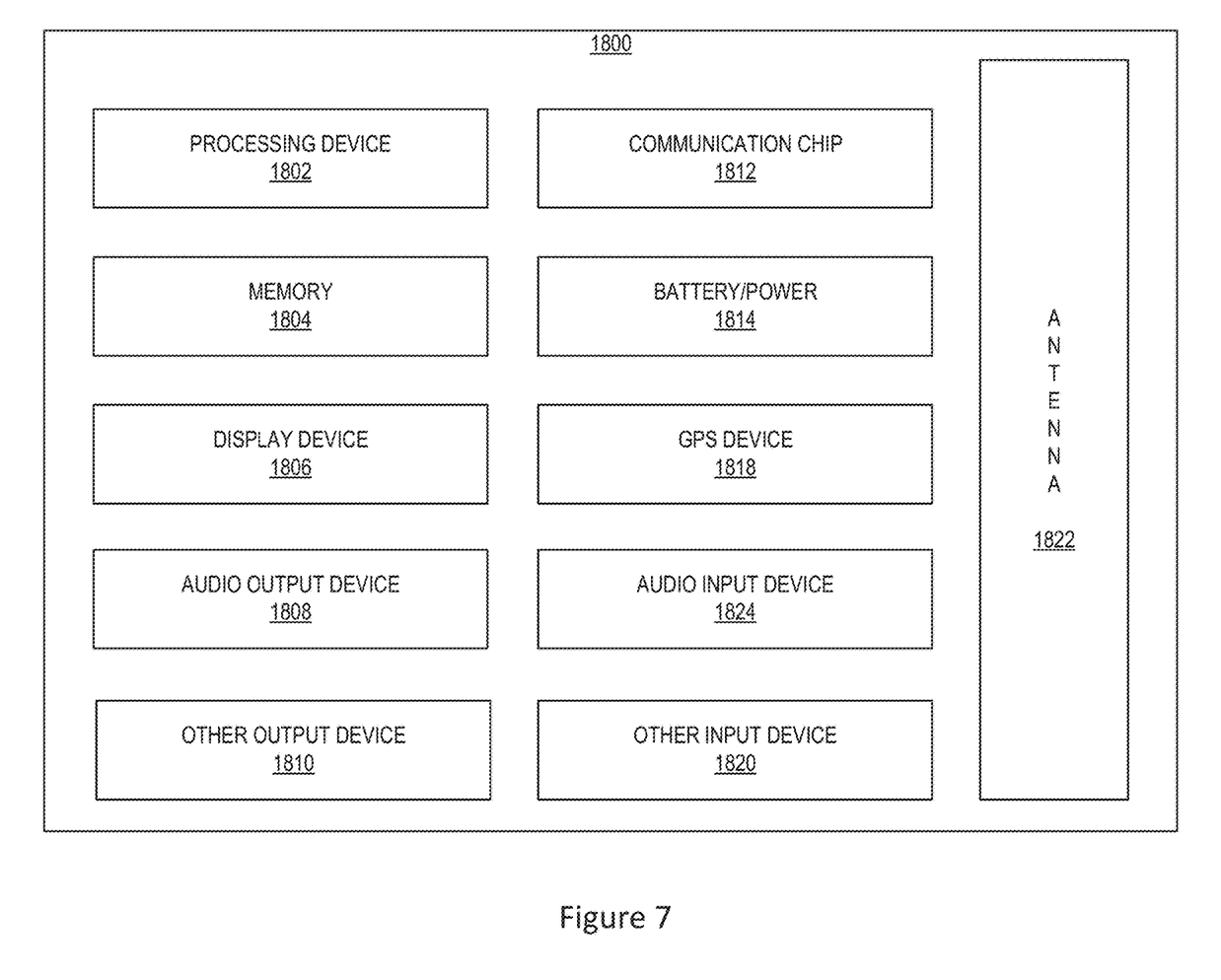
FIG. 7 is a block diagram of an example electrical device that may include a microelectronic package with mold-integrated components, in accordance with various embodiments.

FIG. 7 is a block diagram of an example electrical device 1800 that may include one or more microelectronic packages with mold-integrated components, in accordance with any of the embodiments disclosed herein. For example, any suitable ones of the components of the electrical device 1800 may include one or more of the IC device assemblies 1700, microelectronic packages 100, 200, or 300, etc., or some other component as discussed or disclosed herein. A number of components are illustrated in FIG. 7 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 7, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), CPUs, GPUs, cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), nonvolatile memory (e.g., ROM), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

Examples of Various Embodiments

Example 1 includes a microelectronic package comprising: a substrate with an overmold material deposited thereon; a die in the overmold material, wherein an inactive side of the die is coupled with a face of the substrate; a TMV in the overmold material, wherein the TMV is communicatively coupled with the substrate, and wherein an active side of the die is communicatively coupled with the TMV by a trace in the overmold material.

Example 2 includes the microelectronic package of example 1, wherein the overmold material includes a plurality of shield TMVs positioned therein, wherein the plurality of shield TMVs electromagnetically shield the die.

Example 3 includes the microelectronic package of example 2, wherein the plurality of shield TMVs extend from the face of the substrate through an entirety of the overmold material.

Example 4 includes the microelectronic package of example 3, wherein a shield TMV of the plurality of shield TMVs is coupled with another shield TMV of the plurality of shield TMVs by a conductive element that is coupled with ground.

Example 5 includes the microelectronic package of any of examples 1-4, wherein the die is a PA, an IPD, an acoustic wave resonator (AWR), a switch, a low-noise amplifier (LNA), or a digital logic.

Example 6 includes the microelectronic package of any of examples 1-4, wherein the SMD is an inductor, a capacitor, or a resistor.

Example 7 includes the microelectronic package of any of examples 1-4, wherein the overmold material includes a plurality of layers of overmold material, wherein a layer of the plurality of layers has a z-height of between 100 micrometers ("microns") and 200 microns as measured in a direction perpendicular to the face of the substrate.

Example 8 includes the microelectronic package of any of examples 1-4, wherein the microelectronic package further comprises: a second TMV in the overmold material, wherein the second TMV is communicatively coupled with the substrate; and a surface mount device (SMD) in the overmold material, wherein the SMD is communicatively coupled with the substrate by the second TMV.

Example 9 includes the microelectronic package of any of examples 1-4, further comprising a thermal conductive material in the overmold material, wherein the thermal conductive material is thermally coupled with the die.

Example 10 includes a microelectronic package comprising: a substrate with an overmold material deposited thereon, wherein the overmold material includes a plurality of layers of overmold material; a TMV in the overmold material; and a SMD in the overmold material, wherein the SMD is communicatively coupled with the substrate by the TMV.

Example 11 includes the microelectronic package of example 10, wherein the SMD is an inductor, a capacitor, or a resistor.

Example 12 includes the microelectronic package of example 10, wherein the SMD is communicatively coupled with the TMV by a trace that is positioned within the overmold material.

Example 13 includes the microelectronic package of any of examples 10-12, wherein the SMD is a first SMD, and wherein the microelectronic package further comprises a second SMD.

Example 14 includes the microelectronic package of example 13, wherein the first SMD is positioned at a first distance away from the substrate, and the second SMD is positioned a second distance away from the substrate, and wherein the first distance and the second distance are different from one another.

Example 15 includes the microelectronic package of any of examples 10-12, further comprising a die that is communicatively coupled with the substrate, and wherein the die is positioned within the overmold material.

Example 16 includes the microelectronic package of example 15, wherein a first portion of the overmold material is positioned between the die and the substrate, and wherein the die is positioned between a second portion of the overmold material and the substrate.

Example 17 includes the microelectronic package of example 15, wherein the die is a PA, an IPD, an acoustic wave resonator (AWR), a switch, a LNA, or a digital logic.

Example 18 includes the microelectronic package of example 15, wherein the overmold material includes a plurality of shield TMVs positioned therein, wherein the plurality of shield TMVs electromagnetically shield the die.

Example 19 includes a method of forming a microelectronic package, wherein the method comprises: forming, on a substrate, a first layer of overmold material; forming, in the first layer of the overmold material, a TMV that is communicatively coupled with the substrate; positioning, on the first layer of the overmold material, an electronic element such that the electronic element is communicatively coupled with the TMV; forming, on the first layer of the overmold material, a second layer of overmold material that at least partially surrounds the electronic element.

Example 20 includes the method of example 19, wherein the method further comprises: forming, on the first layer of the overmold material, a conductive trace; where in positioning the electronic element includes communicatively coupling the electronic element to the conductive trace.

Example 21 includes the method of example 19, wherein the electronic element is a passive element.

Example 22 includes the method of example 21, wherein the passive element is an inductor, a capacitor, or a resistor.

Example 23 includes the method of example 19, wherein the electronic element is an active element.

Example 24 includes the method of example 23, wherein the active element is a power amplifier (PA), an integrated passive device (IPD), an acoustic wave resonator (AWR), a switch, a low-noise amplifier (LNA), or a digital logic.

Example 25 includes the method of any of examples 19-24, further comprising: coupling, prior to formation of the first layer of overmold material, an inactive side of a die to the substrate; forming, in the first layer of the overmold material, a second TMV; and communicatively coupling, by a conductive trace positioned in the overmold material, the die to the second TMV.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A microelectronic package comprising:
an overmold material;
a redistribution layer (RDL) configured to provide electrical interconnection within the overmold material, wherein the RDL comprises at least one electrically conductive mold interconnect;
a die in the overmold material electrically coupled with the RDL on an active side of the die; and
a through-mold via (TMV) in the overmold material, wherein:
the TMV is electrically coupled with the RDL by the mold interconnect,
the TMV comprises a shield TMV, and
the shield TMV electromagnetically shields the die.

2. The microelectronic package of claim 1, further comprising a surface mount device (SMD) in the overmold material, wherein the SMD is electrically coupled with the TMV.

3. The microelectronic package of claim 2, wherein the die comprises a first die, wherein the SMD comprises a second die.

4. The microelectronic package of claim 2, wherein the SMD comprises an inductor, a capacitor, or a resistor.

5. The microelectronic package of claim 1, wherein the overmold material comprises a first layer and a second layer disposed on the first layer.

6. The microelectronic package of claim 5, wherein the mold interconnect of the RDL is disposed between the first layer and the second layer.

7. The microelectronic package of claim 5, further comprising a SMD in the overmold material electrically coupled to the TMV, wherein the SMD extends across the first layer and the second layer.

8. The microelectronic package of claim 1, further comprising:
a first SMD in the overmold material electrically coupled to the RDL and positioned at a first distance perpendicular to the active side of the die; and a second SMD in the overmold material electrically coupled to the RDL and positioned at a second distance perpendicular to the active side of the die, wherein the first distance is different from the second distance.

9. The microelectronic package of claim 1, wherein the RDL comprises a one turn in-mold inductor electrically coupled to the mold interconnect.

10. The microelectronic package of claim 1, wherein the overmold material includes a plurality of layers of overmold material, wherein a layer of the plurality of layers has a thickness of between 100 micrometers ("microns") and 200 microns as measured in a direction perpendicular to the active side of the die.

11. The microelectronic package of claim 1, further comprising a substrate electrically coupled to the die, wherein the overmold material is disposed on a face of the substrate.

12. The microelectronic package of claim 11, wherein the active side of the die is coupled with the face of the substrate.

13. The microelectronic package of claim 11, wherein the die comprises an inactive side opposite to the active side, wherein the inactive side of the die is coupled with the face of the substrate.

14. The microelectronic package of claim 1, wherein the die comprises an inactive side opposite to the active side, wherein the microelectronic package further comprises a thermal conductive material thermally coupled with the inactive side of the die.

15. A microelectronic package assembly comprising:
an overmold material;
a redistribution layer (RDL) in the overmold material configured to provide electrical interconnection within the overmold material, wherein the RDL comprises at least one electrically conductive mold interconnect;
a die in the overmold material electrically coupled with the RDL on an active side of the die;
a through-mold via (TMV) disposed in the overmold material, wherein the TMV is electrically coupled with the RDL by the mold interconnect, and the TMV is a shield TMV configured to electromagnetically shield the die; and
a circuit board electrically coupled with the RDL and the TMV.

16. The microelectronic package assembly of claim 15, wherein the circuit board comprises a package substrate or a printed circuit board (PCB).

17. The microelectronic package of claim 15, further comprising a surface-mount device (SMD) in the overmold material, wherein the SMD is electrically coupled with the TMV, wherein the SMD is an inductor, a capacitor, or a resistor.

18. A method of forming a microelectronic package, comprising:
forming a first layer of overmold material;
forming, in the first layer of the overmold material, a through-mold via (TMV) and a redistribution layer (RDL) configured to provide electrical interconnection within the overmold material, wherein the RDL comprises at least one conductive mold interconnect;
positioning, on the first layer of the overmold material, an electronic element such that the electronic element is electrically coupled with the RDL;
forming, on the first layer of the overmold material, a second layer of overmold material that at least partially surrounds the electronic element; and
conductively connecting the TMV to an electromagnetic interference (EMI) shield such that the TMV is configured to provide electromagnetic shielding to the die when conductively connected to a ground connection.

19. The method of claim 18, further comprising:
forming, on the first layer of the overmold material, a conductive trace in the RDL electrically coupled with the TMV, wherein positioning the electronic element includes electrically coupling the electronic element to the conductive trace.

* * * * *

UNITED STATES PATENT AND TRADEMARK OFFICE
CERTIFICATE OF CORRECTION

| | | |
|---|---|---|
| PATENT NO. | : 11,694,962 B2 | |
| APPLICATION NO. | : 17/229991 | |
| DATED | : July 4, 2023 | |
| INVENTOR(S) | : Georgios Dogiamis et al. | |

It is certified that error appears in the above-identified patent and that said Letters Patent is hereby corrected as shown below:

In the Claims

In Column 20, Claim 17, Line 9, delete "package" and insert -- package assembly --, therefor.

Signed and Sealed this
Eighth Day of August, 2023

*Katherine Kelly Vidal*

Katherine Kelly Vidal
*Director of the United States Patent and Trademark Office*